(12) United States Patent
Pramanick et al.

(10) Patent No.: US 6,350,678 B1
(45) Date of Patent: Feb. 26, 2002

(54) CHEMICAL-MECHANICAL POLISHING OF SEMICONDUCTORS

(75) Inventors: Shekhar Pramanick, Fremont; Kai Yang, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/534,906

(22) Filed: Mar. 23, 2000

Related U.S. Application Data
(60) Provisional application No. 60/154,416, filed on Sep. 17, 1999.

(51) Int. Cl.[7] ..................... H01L 21/4763; H01L 21/44; H01L 21/302; H01L 21/461
(52) U.S. Cl. ...................... 438/633; 438/622; 438/690; 438/692; 438/693; 438/687
(58) Field of Search ................................ 438/633, 691, 438/692, 693, 690, 622, 624, 625, 626, 627, 628, 629, 631, 687

(56) References Cited

U.S. PATENT DOCUMENTS

| | | | | |
|---|---|---|---|---|
| 5,928,962 A | * | 7/1999 | Farkas et al. ................ | 438/692 |
| 6,227,949 B1 | * | 5/2001 | Yi et al. ........................ | 451/57 |
| 6,235,071 B1 | * | 5/2001 | Tsuchiya et al. ............... | 51/309 |

FOREIGN PATENT DOCUMENTS

JP    11-214387    * 8/1999

OTHER PUBLICATIONS

Palla et al, "Correlation of Observed Stability and Polishing Performance to Abrasive Particle Size for CMP", Electronics Manufacturing Technology Symposium Twenty–fourth IEEE/CPMT, Oct. 1999 , pp 362–369.*

Iguchi et al, "Full–0.56 micronmeter Pitch Copper Interconnects for a High Performance 0.15–micrometer CMOS Logic Device", Electronics Device Meeting, 1999, IEDM Technical International, Dec 1999, pp 615–618.*

* cited by examiner

*Primary Examiner*—Charles Bowers
*Assistant Examiner*—Thanhha Pham
(74) *Attorney, Agent, or Firm*—Mikio Ishimaru

(57) ABSTRACT

A method for manufacturing an integrated circuit using damascene processes is provided in which planar surfaces of contacting conductive metal channels and vias are subjected to chemical-mechanical polishing under a pressure which avoids cold working and to two steps of chemical-mechanical polishing in which the first step is performed using a slurry with a first sized abrasive to expose a first dielectric layer in which the conductive metal channel is embedded and to provide a planar polished surface of the conductive material, and a second step is performed using a second slurry with a second sized abrasive larger than said first sized abrasive to provide a planar rough-polished surface of the conductive material. The second polishing also performed at a pressure which avoids cold working, which causes a highly polycrystalline structure and a high dislocation density, in the conductive material at its planar polished surface.

25 Claims, 2 Drawing Sheets

CHEMICAL-MECHANICAL POLISHING OF SEMICONDUCTORS

CROSS-REFERENCE TO RELATED APPLICATION(S)

This application claims the benefit of U.S. Provisional Patent Application No. 60/154,416 filed on Sep. 17, 1999, which is incorporated herein by reference thereto.

TECHNICAL FIELD

The present invention relates generally to semiconductors and more specifically to a manufacturing method for dual damascene semiconductors.

BACKGROUND ART

In the process of manufacturing integrated circuits, after the individual devices such as the transistors have been fabricated in the silicon substrate, they must be connected together to perform the desired circuit functions. This connection process is generally called "metallization" and is performed using a number of different photolithographic and deposition techniques.

One metallization process, which is called the "damascene" technique, starts with the placement of a first channel dielectric layer, which is a silicon dioxide or other oxide layer, over the semiconductor devices. A first damascene step photoresist is then placed over the dielectric layer and is photolithographically processed to form the pattern of the first channels. An anisotropic etch, an oxide etch, is then used to etch out the channel dielectric layer to form the first channel openings. The damascene step photoresist is then stripped and a conductive material is deposited in the first channel openings.

Some conductive materials, such as copper, require preparatory steps before deposition. An optional adhesion material, such as tantalum or titanium, is deposited followed by a barrier material, such as tantalum nitride or titanium nitride. The combination of the adhesion and barrier material is collectively referred to as "barrier layer" herein. The barrier layer is used to prevent failure causing diffusion of the conductive material of the channels into the dielectric layer and the semiconductor devices. A seed layer is then deposited on the barrier layer to form a conductive material base, or "seed", for subsequent electro-deposition of the conductive material.

The conductive material is then deposited in the first channel openings and subjected to a chemical-mechanical polishing process which removes the materials above and outside the first channel dielectric layer. Chemical-mechanical polishing (referred to as "CMP") typically involves mounting a wafer face down on a holder and rotating the wafer face under pressure against a polishing pad mounted on a polishing platen, which in turn is rotating or is in orbital state. A slurry or slurries containing a chemical that chemically interacts with the facing wafer layer and an abrasive that physically removes that layer is flowed between the wafer and the polishing pad or on the pad near the wafer. A combination of the chemical reaction between the slurry and the layer being polished and the mechanical interaction between abrasives within the slurry and the layer being polished cause the planarization of the layer. During IC fabrication, this technique is commonly applied to planarize various wafer layers, such as dielectric layers, metallization, etc.

With the CMP, the conductive material is formed into the first channel dielectric layer to form the first conductive channels in a "damascene" process. After the CMP process the conductive material in the channels is passivated by deposition of a high dielectric constant dielectric layer. The dielectric layer protects the conductive material from oxidation and is intended to prevent the diffusion of the conductive material into subsequent dielectric layers.

For multiple layers of channels, the "dual damascene" technique is used in which the channels and vias are formed at the same time. In one example, the via formation step of the dual damascene technique starts with the deposition of a thin dielectric etch stop layer, such as a silicon nitride, over the first channels and the first channel dielectric layer. Subsequently, a via dielectric layer is deposited on the etch stop layer. This is followed by deposition of a thin via dielectric etch stop layer, generally another nitride layer. Then, a via step photoresist is used in a photolithographic process to designate round via areas over the first channels.

A stop layer etch, generally a nitride etch, is then used to etch out the round via areas in the via nitride. The via step photoresist is then removed, or stripped. A second channel dielectric layer is then deposited over the via dielectric stop layer and the exposed via dielectric layer. A second damascene step photoresist is placed over the second channel dielectric layer and is photolithographically processed to form the pattern of the second channels. An anisotropic etch is then used to etch the second channel dielectric layer and the via dielectric layer to form the second channel openings and the via areas down to the thin etch stop layer above the first channels. The damascene photoresist is then removed, and a stop layer etch process removes the via etch stop layer above the first channels in the via areas.

For conductive materials such as coppers as previously described, a barrier layer is then deposited to coat the via openings and the second channel openings. Next, a seed layer is deposited on the barrier layer. This is followed by a deposition of the conductive material in the second channel openings and the via openings to simultaneously fill the second channel and the vias. A second CMP process defines the second channel and leaves the two vertically separated channels connected by a cylindrical via. Again, after the CMP process, the conductive material in the channels is passivated by deposition of another dielectric layer. The dielectric layer protects the conductive material from oxidation and is intended to prevent the diffusion of the conductive material into dielectric layers.

The use of the damascene techniques eliminates metal etch and dielectric gap fill steps typically used in the metallization process. The elimination of metal etch steps is important as the semiconductor industry moves from aluminum to other metallization materials, such as copper, which are very difficult to etch.

Unfortunately, as the size of semiconductor devices is decreased in order to increase speed and reduce cost, electro-migration increases in the channels connecting the semiconductor devices. Electro-migration is the movement of conductive material along channels and vias due to current flow in the channels and vias. The causes of electro-migration are not fully understood for all the different types of semiconductor devices, but electro-migration can lead to voids in the channels and vias, which lead to reduced performance or failure of the semiconductor devices. Solutions for eliminating electro-migration have been long sought by, but have eluded, those skilled in the art.

DISCLOSURE OF THE INVENTION

The present invention provides a method for reducing electro-migration in conductive material channels in semiconductors due to poor adhesion and CMP-induced polycrystallization and dislocations by performing initial planarization using reduced mechanical polishing pressure below three pounds/square inch at the surface of the conductive material channels and introducing a larger particle size abrasive to provide a rough conductive material contact areas at the surface of the conductive material channels after initial planarization.

The present invention further provides a method for reducing electro-migration along conductive material channels in semiconductors due to poor adhesion between barrier and conductive layers by providing a CMP roughening step after a conventional CMP step.

The present invention further provides a method for reducing electro-migration in conductive material channels in semiconductors due to CMP-induced polycrystallization and dislocations by significantly reducing the mechanical polishing parameters for the chemical-mechanical polishing process.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
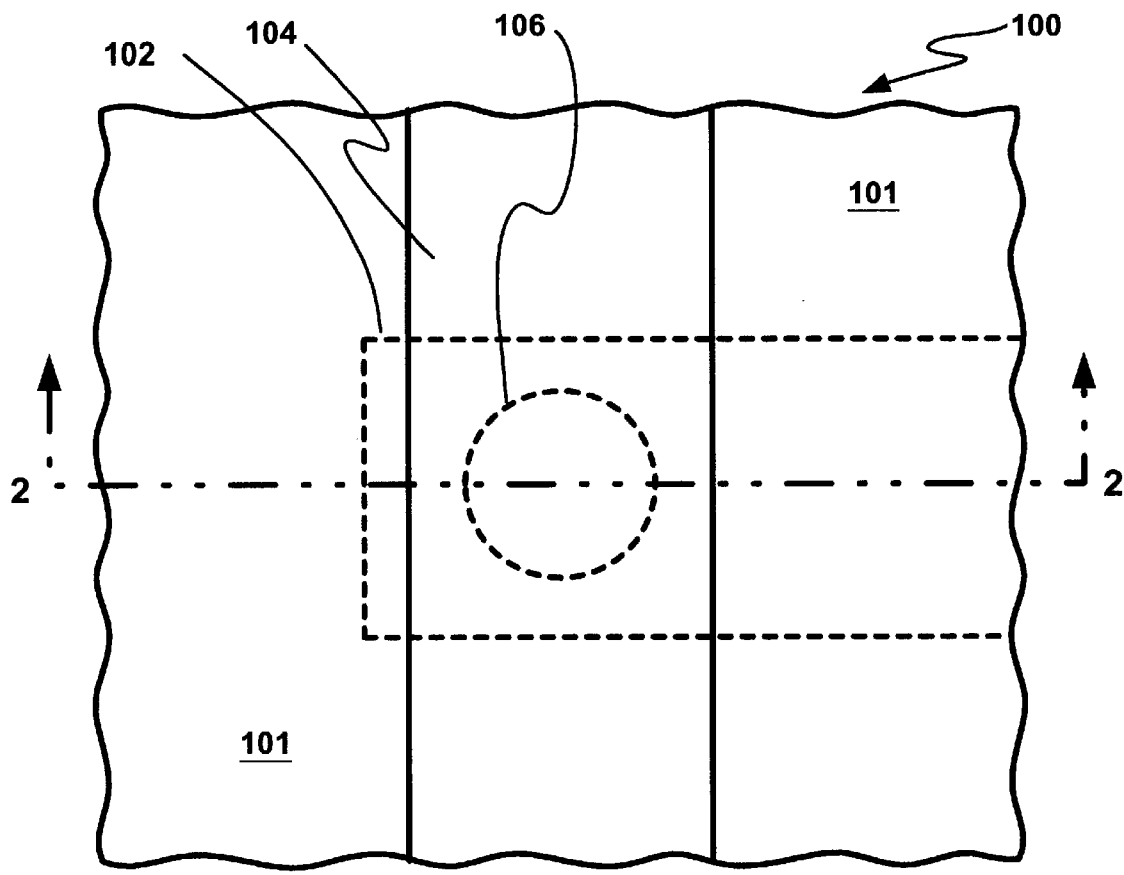
FIG. 1 (PRIOR ART) is a plan view of aligned channels of the prior art integrated circuit.

Referring now to FIG. 1 (PRIOR ART), therein is shown a plan view of a prior art pair of perpendicularly aligned semiconductor channels of a conductive material, such as copper, disposed on a production integrated circuit 100 in a dielectric layer 101. A first channel 102 is shown disposed below a second channel 104 which extends substantially perpendicular to the first channel 102 in the plan view. A cylindrical via 106 connects the first and second channels 102 and 104 and is a part of the second channel 104 by being deposited concurrently by a dual damascene technique.

Figure 2:
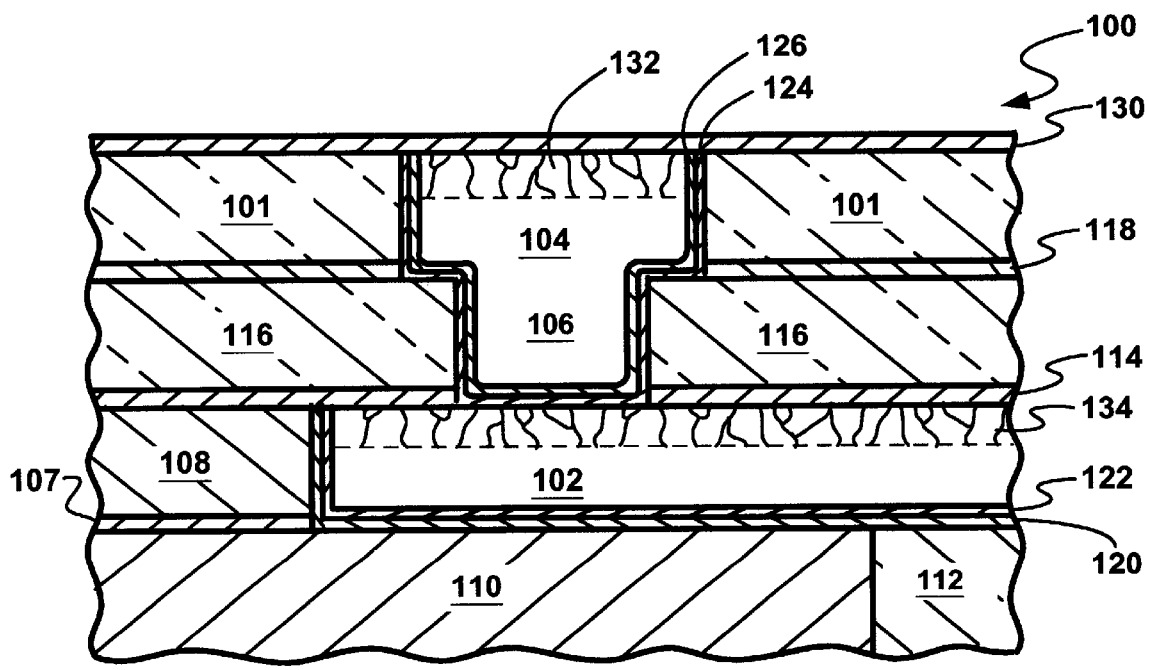
FIG. 2 (PRIOR ART) is a cross-section of FIG. 1 (PRIOR ART) along line 2—2 during an intermediate stage of the processing.

Referring now to FIG. 2 (PRIOR ART), therein is shown a cross-section of FIG. 1 (PRIOR ART) along 2—2. The first channel 102 is disposed in a first stop (nitride) layer 107 and the first channel dielectric layer 108 over a pre-metal dielectric layer 110 and a contact via 112, of a metal such as tungsten, to a semiconductor device (not shown). The first and second channels 102 and 104 are connected by the cylindrical via 106 and are in horizontal planes separated vertically by an etch stop layer 114, a via dielectric layer 116, and a thin via etch stop layer 118. Also shown disposed around the first channel 102 are a barrier layer 120 and seed layer 122, and around the second channel 104 and the cylindrical via 106 is a barrier layer 124 and seed layer 126. For simplicity, these layers are not shown in FIG. 1 (PRIOR ART).

For copper or copper alloy conductive materials, the barrier layers are made up of barrier materials such as tantalum, titanium, tungsten, their alloys, compounds thereof (especially their nitrides) and combinations thereof.

The barrier materials are intended to prevent detrimental migration of copper into the dielectric materials. The copper seed layers are deposited on top of the barrier layers to provide a conductive layer for the subsequent electroplating of copper which makes up the channels.

After deposition of the conductive material which will fill the channels and cover the dielectric layers, the conductive material outside the channels must be removed. The removal is accomplished using a chemical-mechanical polishing process. Chemical-mechanical polishing (referred to as "CMP") typically involves mounting a wafer face down on a holder and rotating the wafer face under pressure against a polishing pad mounted on a polishing platen, which in turn is rotating or is in orbital state. A slurry or slurries containing a chemical that chemically interacts with the facing wafer layer and an abrasive that physically removes that layer is flowed between the wafer and the polishing pad or on the pad near the wafer. A combination of the chemical reaction between the slurry and the layer being polished and the mechanical interaction between abrasives within the slurry and the layer being polished cause the planarization of the layer. During IC fabrication, this technique is commonly applied to planarize various wafer layers, such as dielectric layers, metallization, etc.

It should be understood that, conventionally, each layer of dielectric material and conductive material is subjected to the CMP process until a smoothness of approximately 100 Å is reached before the deposition of the subsequent layers. Thus, the first channel dielectric layer 108 and the first channel 102 are subject to the CMP process in preparation for the etch stop layer 114. And the second channel dielectric layer 101 and second channel 104 are subject to the CMP process in preparation for a protective layer 130 of silicon nitride.

In the conventional CMP process, for example, a tungsten layer of 6,000 Å thickness would be mechanically polished and planarized in about two minutes using a pressure of four to five pounds per square inch and a rotational speed of around 30 revolutions per minute. The chemical polish and planarization would use a slurry of 10% by weight ferric nitrate solution in a 1:1 ratio with 6% by weight alumina abrasive in deionized water and a pH generally within the range of 1.2–1.5. The abrasive would have a size distribution below 1.0 micron, a mean aggregate diameter less than about 0.4 micron, and a force sufficient to repel and overcome the van der Waals forces between abrasive aggregates themselves (so as to avoid clumping of the abrasive aggregates). Such an abrasive has been found to be effective in minimizing or avoiding scratching, pit marks, divots and other surface imperfections during polishing. The aggregate size distribution in the present invention may be determined utilizing known techniques such as transmission electron microscopy (TEM).

The mean aggregate diameter refers to the average equivalent spherical diameter when using TEM image analysis, i.e., based on the cross-sectional area of the aggregate. By "force" is meant that either the surface potential or the hydration force of the particles must be sufficient to repel an overcome the van der Walls attractive forces between the particles.

Those having ordinary skill in the art would know from the above example, the prior art, and the current state of the art how to scale the conventional CMP process for smaller geometry semiconductor devices and different material layers by changing the chemical and mechanical polishing parameters.

It has been determined that the pressure applied to the pad for copper conductive materials creates a highly polycrystalline copper structure with a high dislocation density down to below 600 Å from the polished surface. These high crystal boundary regions are designated by the numerals 132 and 134. The crystal boundaries of the highly polycrystalline structure and the high dislocation density are caused by cold working of the copper. Both these features contribute to electro-migration of copper among the channels which eventually cause voids which in turn lead to failures of the connections between the semiconductor devices in the integrated circuit.

Figure 3:
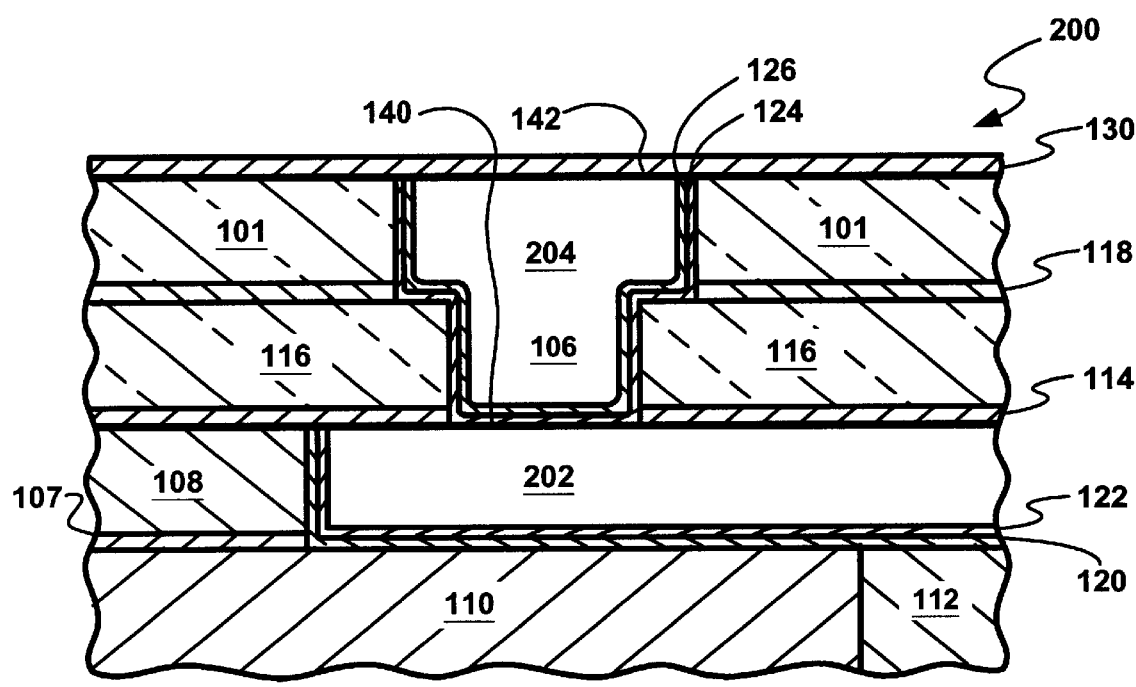
FIG. 3 is a cross-section similar to FIG. 2 (PRIOR ART) during an intermediate stage of the processing of the present invention.

Referring now to FIG. 3, therein is shown a cross-section similar to FIG. 2 (PRIOR ART) of an integrated circuit 200. For ease of understanding, the same elements as shown in FIG. 2 (PRIOR ART) are numbered with the same numbers. A first channel 202 is shown disposed in a first channel dielectric layer 108 over the pre-metal dielectric layer 110 and the contact via 112, to a semiconductor device (not shown). The first channel 202 differs from the first channel 102 of FIG. 2 in being free of the high crystal boundary region 132. Disposed vertically above the first channel 202 are the etch stop layer 114, the via dielectric layer 116, the thin via etch stop layer 118, and the second channel dielectric layer 101. Again, the dielectric layers are generally of silicon dioxide, and the etch stop layers are generally of silicon nitride. Also shown disposed around the first channel 102 are the barrier layer 120 and the seed layer 122.

In contact with the first channel 202 is the barrier layer 124. Inside the barrier layer 124 is a seed layer 126 which contains a via 106 and a second channel 204. The second channel 204 differs from the second channel 104 of FIG. 2 in being free from the high crystal boundary region 134.

In the preferred embodiment, the barrier layers 120 and 124 are made up of barrier materials such as tantalum, titanium, tungsten, their alloys, compounds thereof (especially nitrides), and combinations thereof. The channels 202 and 204 are generally of copper, aluminum, polysilicon, gold, silver, alloys thereof, and combinations thereof.

In FIG. 3, the highly polycrystalline structure and the high dislocation density regions 132 and 134 have been eliminated by the processing of the present invention. Further, the interlayer surfaces of the first channel 202 and the second channel 204 have been roughened over the conventional CMP finish as indicated by respective roughened areas 140 and 142.

In production, a conventional first damascene process is used to deposit the first channel 202 in the first channel dielectric layer 108. The damascene process is a photolithographic process which uses a mask to define a first channel opening in the first channel dielectric layer 108. The first channel opening is then filled with the barrier layer 120 and the seed layer 122 which line the opening. A first conductive material, such as copper or a copper alloy, is deposited using conventional metal deposition techniques, such as physical vapor deposition, chemical vapor deposition, or a combination thereof, although electroplating is preferred, to form the first channel 202. The first channel 202 and the first channel dielectric 108 are subject to the reduced pressure CMP and rough polish CMP of the present invention as will later be described.

The etch stop layer 114, the via dielectric layer 116, and the via etch stop layer 118 are then successively deposited on top of the first channel 202 and the first channel dielectric layer 108 using conventional deposition techniques.

By using the via photoresist and the via photolithographic process followed by nitride etching of the via etch stop layer 118, the basis for the cylindrical via 106 is formed. There is then a subsequent deposition of the second channel dielectric layer 101. The second damascene process uses a further mask to define the second channel opening in the second channel dielectric layer 101. Using an anisotropic dielectric etch, the second damascene process also forms the cylindrical via 106 down to the etch stop layer 114. The anisotropic dielectric etch etches faster in the vertical direction of FIG. 3 than in the horizontal direction. The nitride etch of the etch stop layer 114 then exposes a portion of a first channel 202.

Next, the barrier layer 124 and the seed layer 126 are deposited to line the second channel opening by a process such as physical-vapor deposition or chemical-vapor deposition. The conductive material, generally copper or a copper alloy, is deposited by using the seed layer 126 as an electrode for electroplating copper ions from a plating bath. After the second channel opening is filled, the CMP process of the present invention is used to polish the conductive material, the seed layer 126, and the barrier layer 124 down to the surface of the second channel dielectric layer 101. This damascenes the conductive material into the second channel dielectric layer 101 to form a second channel 204. It also leaves a low dislocation density and rough polished surface on the second channel dielectric 101 and, more particularly, on the second channel 204, as indicated by the roughened area 142.

A further interconnect layer of conductive material could be deposited over the second channel 204 or a protective layer 130 could also be deposited.

In the present invention, the CMP is performed at a pressure which is heuristically determined to eliminate the cold working which causes a highly polycrystalline structure and a high dislocation density in the conductive material of the first and second channels 202 and 204. In the preferred mode for 0.25-micron semiconductor devices, the pressure is less than three pounds per square inch. The pressure decreases as the size of the semiconductor devices decrease and is determined by the avoidance of the highly polycrystalline structure and the high dislocation density. The terms "highly polycrystalline structure" and "high dislocation density" are well known to those skilled in the art as factors which negatively affect electro-migration resistance.

Further in the present invention, the CMP step uses an abrasive of a size distribution below 1.0 micron in diameter (i.e., the size of the abrasive particles are under 1.0 micron in their largest direction), a mean aggregate diameter less than about 0.4 micron, and a force sufficient to repel and overcome the Van der Waals forces between abrasive aggregates themselves is completed. This is then followed by a rough polish CMP which could be a separate step or just involve the introduction of larger size abrasive particles to the light pressure CMP. The larger size abrasive particles are of a size distribution between 1.0 and 2.0 microns in diameter (i.e., the size of the abrasive particles are between 1.0 and 2.0 microns in their largest directions), a mean aggregate diameter greater than about 1.4 microns, and a force sufficient to repel and overcome the Van der Waals forces between abrasive aggregates themselves. This causes the surfaces of the channels to be rougher than the conventional smooth polish and has been found to increase electro-migration resistance along the length of the channels by a factor of 3.

While the best mode utilizes copper as the conductive material, it should be understood that the present invention is applicable to other conductive materials such as aluminum, silver, gold, alloys thereof, compounds thereof, and combinations thereof. Similarly, the barrier layer can be of tantalum, titanium, tungsten, alloys thereof, compounds thereof (especially nitrides), and combinations thereof.

The preferred embodiment of the present invention is directed to using a dual damascene technique. However, it also will be recognized that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing an integrated circuit, comprising the steps of:

providing a semiconductor device with a first dielectric layer formed thereon;

forming a first opening in said first dielectric layer, said forming said first opening exposing said semiconductor device;

depositing a conductive material over said first dielectric layer and filling said first opening;

polishing said conductive material outside of said first opening using a slurry with a first sized abrasive to expose said first dielectric layer and provide a planar polished surface of said conductive material; and polishing said conductive material inside of said first opening using a second slurry with a second sized abrasive larger than said first sized abrasive.

2. The method as claimed in claim 1 wherein said steps of polishing said conductive material outside and inside said first opening are performed at a pressure which avoids cold working the planar polished surface.

3. The method as claimed in claim 1 wherein said step of polishing said conductive material inside of said first opening is performed after polishing said conductive material outside of said first opening.

4. The method as claimed in claim 1 wherein said step of polishing said conductive material inside of said first opening is performed using a slurry with an abrasive having a size distribution over 1.0 micron in diameter and said step of polishing said conductive material outside of said first opening is performed using a slurry with an abrasive having a size distribution under 1.0 micron in diameter.

5. The method as claimed in claim 1 including a step of forming a barrier layer in said first opening and wherein said step of forming said barrier layer uses a material selected from a group consisting of tantalum, titanium, tungsten, alloys thereof, and combinations thereof.

6. The method as claimed in claim 1 including a step of forming a seed layer in said first opening and wherein said step of forming said seed layer uses a material selected from a group consisting of copper, aluminum, silver, gold, alloys thereof, and combinations thereof.

7. The method as claimed in claim 1 wherein said step of filling said first opening with conductive materials uses a material selected from a group consisting of copper, aluminum, silver, gold, alloys thereof, and combinations thereof.

8. A method of manufacturing an integrated circuit, comprising the steps of:

providing a semiconductor device with a first dielectric layer formed thereon;

forming a first opening in said first dielectric layer, said forming said first opening exposing said semiconductor device;

depositing a conductive material over said first dielectric layer and filling said first opening; and polishing said conductive material outside of said first opening using a slurry with a first sized abrasive having a mean aggregate diameter less than about 0.4 micron to expose said first dielectric layer and provide a planar polished surface of said conductive material;

polishing said conductive material inside of said first opening using a second slurry with a second sized abrasive larger than said first sized abrasive.

9. The method as claimed in claim 8 wherein said step of polishing said conductive material inside said first opening using said second slurry with the second sized abrasive uses a second sized abrasive having a mean aggregate diameter greater than about 1.4 microns.

10. The method as claimed in claim 8 wherein said steps of polishing said conductive material outside and inside said first opening is performed at a pressure which avoids cold working the planar polished surface.

11. The method as claimed in claim 8 including a step of forming a barrier layer in said first opening and wherein said step of forming said barrier layer uses a material selected from a group consisting of tantalum, titanium, tungsten, alloys thereof, and combinations thereof.

12. The method as claimed in claim 8 including a step of forming a seed layer in said first opening and wherein said step of forming said seed layer uses a material selected from a group consisting of copper, aluminum, silver, gold, alloys thereof, and combinations thereof.

13. The method as claimed in claim 8 wherein said step of filling said first opening with said conductive material uses a material selected from a group consisting of copper, aluminum, silver, gold, alloys thereof, and combinations thereof.

14. A method of manufacturing an integrated circuit, comprising the steps of:

providing a semiconductor device with a first dielectric layer formed thereon;

forming a first opening in said first dielectric layer, said forming said first opening exposing said semiconductor device;

depositing a conductive material over said first dielectric layer and filling said first opening;

polishing said conductive material outside of said first opening using a slurry with a first sized abrasive having a size distribution under 1.0 micron in diameter to expose said first dielectric layer and provide a planar polished surface of said conductive material; and polishing said conductive material inside of said first opening using a second slurry with a second sized abrasive larger than said first sized abrasive.

15. The method as claimed in claim 14 wherein said steps of polishing said conductive material outside and inside said first opening are performed at a pressure which avoids cold working the conductive material at the planar polished surface of said conductive material.

16. The method as claimed in claim 14 wherein said step of polishing said conductive material inside of said first opening is performed after polishing said conductive material outside of said first opening.

17. The method as claimed in claim 14 wherein said step of polishing said conductive material inside of said first opening is performed using said second slurry with an abrasive having a size distribution between 1.0 and 2.0 microns in diameter.

18. The method as claimed in claim 14 including a step of forming a barrier layer in said first opening and wherein said step of forming said barrier layer uses a material selected from a group consisting of tantalum, titanium, tungsten, alloys thereof, and combinations thereof.

19. The method as claimed in claim 14 including a step of forming a seed layer in said first opening and wherein said step of forming said seed layer uses a material selected from a group consisting of copper, aluminum, silver, gold, alloys thereof, and combinations thereof.

20. The method as claimed in claim 14 wherein said step of filling said first opening with said conductive material uses a material selected from a group consisting of copper, aluminum, silver, gold, alloys thereof, and combinations thereof.

21. A method of manufacturing an integrated circuit containing a semiconductor device, comprising the steps of:

forming a first channel dielectric layer on the semiconductor device;

forming a first opening in said first channel dielectric layer, said forming said first opening exposing said semiconductor device;

forming a first barrier layer over said first channel dielectric layer and in said first opening in contact with said semiconductor device;

forming a first seed layer over said first barrier layer and in said first opening;

depositing a first conductive material over said first seed layer and filling said first opening;

chemical-mechanical polishing, using a slurry with a first sized abrasive, said first conductive material, said first seed layer, and said first barrier layer outside of said first opening to expose the first dielectric layer and to form a first channel having a first planar polished surface of said first conductive material;

chemical-mechanical polishing, using a slurry with a second sized abrasive larger than said first sized abrasive, said first conductive material, said first seed layer, and said first barrier layer inside of said first opening to form said first channel having a second planar polished surface of said first conductive material;

depositing a protective dielectric layer over the second planar polished surface of said first conductive material to prevent oxidation thereof;

forming a via dielectric layer over said protective dielectric layer;

forming a second channel dielectric layer over said via dielectric layer;

forming a second opening in said second channel dielectric layer and in said via dielectric layer;

forming a via opening in said protective dielectric layer to expose said first channel;

forming a second barrier layer over said first conductive material and said second channel dielectric layer;

forming a second seed layer over said second barrier layer;

depositing a second conductive material over said second barrier layer and filling said second opening and said via opening;

chemical-mechanical polishing, using a slurry with the first sized abrasive, said second conductive material, said second seed layer, and said second barrier layer outside of said second opening to form a second channel having a first planar polished surface of said second conductive material and to expose said second channel dielectric layer; and chemical-mechanical polishing, using a slurry with a second sized abrasive larger than said first sized abrasive, said second conductive material, said second seed layer, and said second barrier layer inside of said second opening to form said second channel having a second planar polished surface of said conductive material.

22. The method as claimed in claim 21 wherein said steps of chemical-mechanical polishing are performed at a pressure of below three pounds per square inch at the planar polished surface.

23. The method as claimed in claim 21 wherein said steps of forming said first and second barrier layers use materials selected from a group consisting of tantalum, titanium, tungsten, alloys thereof, and combinations thereof.

24. The method as claimed in claim 21 wherein said steps of forming said first and second seed layers use materials selected from a group consisting of copper, aluminum, silver, gold, alloys thereof, and combinations thereof.

25. The method as claimed in claim 21 wherein said steps of filling said first and second openings with respective said first and second conductive materials use a material selected from a group consisting of copper, aluminum, silver, gold, alloys thereof, and combinations thereof.

\* \* \* \* \*